(12) United States Patent
Qi et al.

(10) Patent No.: US 11,837,865 B2
(45) Date of Patent: Dec. 5, 2023

(54) HYBRID CIRCUIT BREAKERS

(71) Applicant: ABB S.p.A., Sesto San Giovanni (IT)

(72) Inventors: Li Qi, Cary, NC (US); Yuzhi Zhang, Apex, NC (US); Taosha Jiang, Cary, NC (US)

(73) Assignee: ABB S.p.A., Milan (IT)

(*) Notice: Subject to any disclaimer, the term of this patent is extended or adjusted under 35 U.S.C. 154(b) by 17 days.

(21) Appl. No.: 17/557,258

(22) Filed: Dec. 21, 2021

(65) Prior Publication Data

US 2023/0198248 A1    Jun. 22, 2023

(51) Int. Cl.
| | | |
|---|---|---|
| *H02H 9/02* | (2006.01) | |
| *H01H 9/54* | (2006.01) | |
| *H02H 1/00* | (2006.01) | |
| *H03K 3/017* | (2006.01) | |

(52) U.S. Cl.
CPC ............. *H02H 9/02* (2013.01); *H01H 9/542* (2013.01); *H02H 1/0007* (2013.01); *H03K 3/017* (2013.01)

(58) Field of Classification Search
CPC ........ H02H 3/021; H02H 3/087; H02H 9/021; H02H 9/02; H02H 9/025; H01H 33/596; H01H 9/541; H01H 9/542
See application file for complete search history.

(56) References Cited

U.S. PATENT DOCUMENTS

| | | | |
|---|---|---|---|
| 2007/0121257 A1 | 5/2007 | Maitra | |
| 2010/0254046 A1* | 10/2010 | Liu | H02H 3/087 361/13 |
| 2013/0050880 A1* | 2/2013 | Rozman | H01H 33/596 361/18 |
| 2014/0376140 A1 | 12/2014 | Wu | |
| 2018/0138689 A1 | 5/2018 | Wu | |
| 2018/0301295 A1* | 10/2018 | Dupraz | H01H 33/596 |
| 2019/0348238 A1* | 11/2019 | Johansson | H01H 33/10 |
| 2020/0266624 A1 | 8/2020 | Zhou | |

OTHER PUBLICATIONS

Li, Chunpeng et al., "Modulated Low Fault-Energy Protection Scheme for DC Smart Grids", IEEE Transactions on Smart Grid, vol. 11, Issue 1, Jan. 2020, p. 84-94.
Zhou, Yuanfeng et al., "iBreaker: Intelligent Tri-mode Solid State Circuit Breaker Technology", IEEE International Power Electronics and Application Conference and Exposition, Nov. 2018, 7 pgs.
Extended European Search Report for European Application No. 22213546.9, dated May 30, 2023, 8 pages.

* cited by examiner

*Primary Examiner* — Jared Fureman
*Assistant Examiner* — Christopher J Clark
(74) *Attorney, Agent, or Firm* — Armstrong Teasdale LLP

(57) ABSTRACT

In one aspect, a hybrid circuit protection device for current-limiting a fault current between a source and a load during a fault is provided. The hybrid circuit protection device includes an input configured to couple to the source, an output configured to couple to the load, a return configured to couple the source to the load, a main switch configured to selectively couple the input to the output, a switching network coupled in parallel with the main switch, and a controller. The controller is configured to determine that the main switch has opened in response to the fault current, where the fault current has an initial value, and activate the switching network to current-limit the fault current to less than the initial value during the fault.

20 Claims, 10 Drawing Sheets

HYBRID CIRCUIT BREAKERS

STATEMENT REGARDING FEDERALLY SPONSORED RESEARCH AND DEVELOPMENT

This invention was made with government support under contract number DE-AC02-06CH11357, awarded by the Department of Energy. The government has certain rights in this invention.

BACKGROUND

The field of the disclosure relates to circuit breakers, and more particularly, to hybrid circuit breakers that include fault current limiters.

Circuit breakers are devices which are implemented in a circuit path to protect downstream loads on a branch circuit during faults. During fault conditions at a downstream load, circuit breakers are designed to trip open and de-energize the branch being fed by the circuit breaker. However, de-energizing the branch may also de-energize other loads on the branch, which is undesirable, especially in Direct Current (DC) distribution systems.

Thus, it is desirable to improve the operation and performance of circuit breakers, and more specifically, improve the operation and performance of circuit breakers used in DC distribution systems.

BRIEF DESCRIPTION

In one aspect, a hybrid circuit protection device for current-limiting a fault current between a source and a load during a fault is provided. The hybrid circuit protection device includes an input configured to couple to the source, an output configured to couple to the load, a return configured to couple the source to the load, a main switch configured to selectively couple the input to the output, a switching network coupled in parallel with the main switch, and a controller. The controller is configured to determine that the main switch has opened in response to the fault current, where the fault current has an initial value, and activate the switching network to current-limit the fault current to less than the initial value during the fault.

In another aspect, a method operable by a hybrid circuit protection device for current-limiting a fault current between a source coupled to an input of the hybrid circuit protection device and a load coupled to an output of the hybrid circuit protection device during a fault is provided. The method includes determining if an initial value of the fault current through the main switch is greater than a threshold value, where the main switch selectively couples the input with the output, and responsive to determining that the initial value of the fault current is greater than the threshold value, opening the main switch, and activating a switching network coupled in parallel with the main switch to current-limit the fault current to less than the initial value during the fault.

In another aspect, a hybrid circuit protection device for current-limiting a fault current between a source and a load during a fault is provided. The hybrid circuit protection device includes a first input terminal and a second input terminal configured to couple to the source, a first output terminal and a second output terminal configured to couple to the load, a main switch configured to selectively couple the first input terminal with the first output terminal, and a switching network. The switching network includes a solid-state switch in series with an inductor, the solid-state switch in series with the inductor coupling the first input terminal with the first output terminal. The switching network further includes a device forming a selective conduction path from a junction between the solid-state switch and the inductor to the second input terminal and the second output terminal. The hybrid circuit protection device further includes a controller configured to determine that the main switch has opened in response to the fault current, where the fault current has an initial value, and modify a duty cycle of the sold-state switch to current-limit the fault current to less than the initial value during the fault.

DRAWINGS

These and other features, aspects, and advantages of the present disclosure will become better understood when the following detailed description is read with reference to the accompanying drawings in which like characters represent like parts throughout the drawings, wherein.

Figure 3:
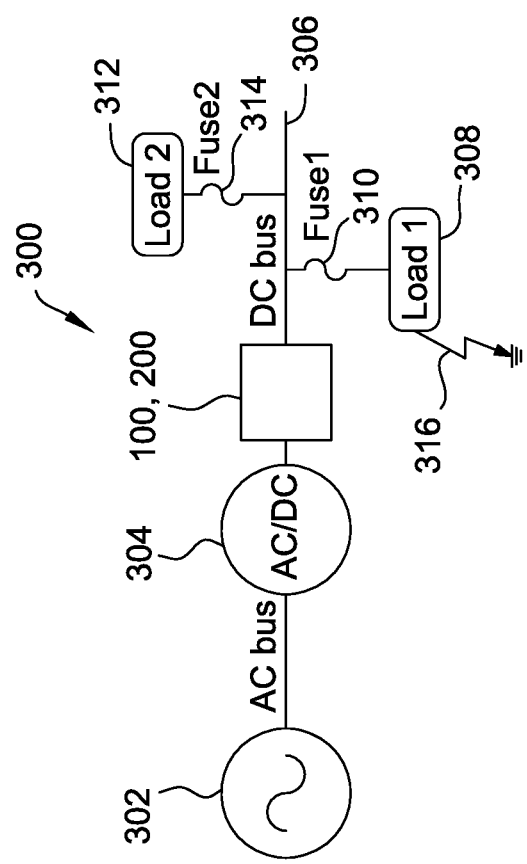
FIG. 3 depicts a hybrid electrical distribution system in an example embodiment.
Figure 4A:
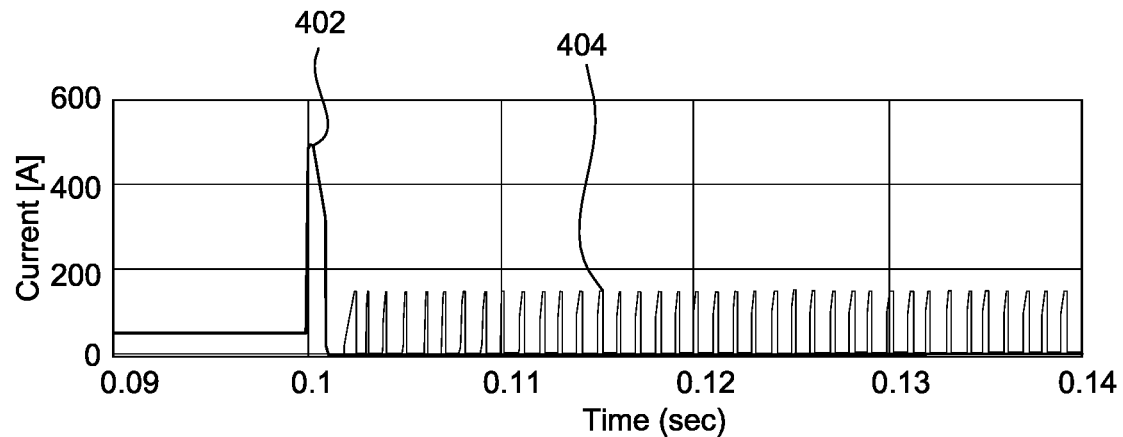
Figure 4B:
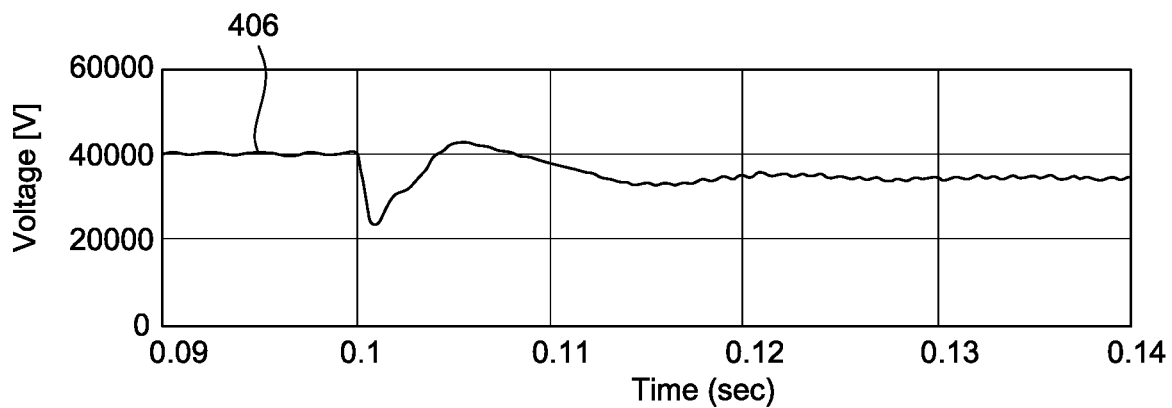
Figure 4C:
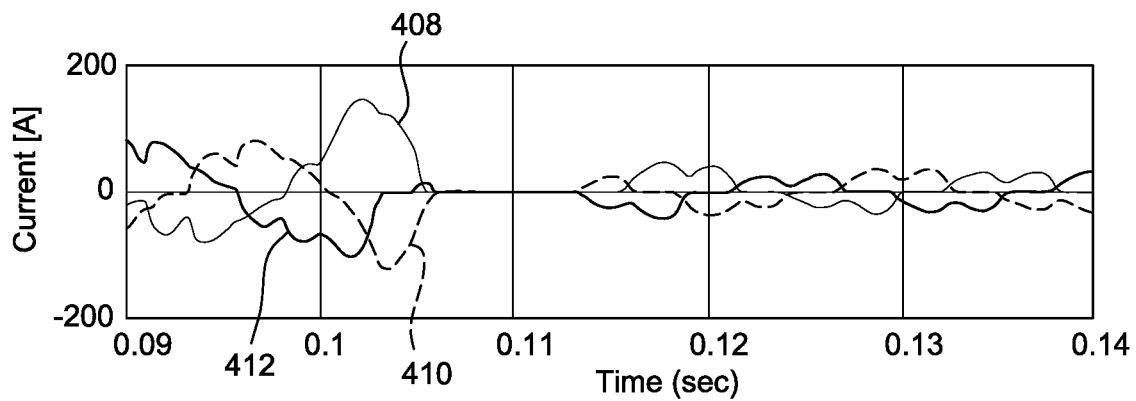

FIGS. 4A, 4B, and 4C depict simulated current and voltage waveforms in the distribution system of FIG. 3 during a fault.

Figure 5:
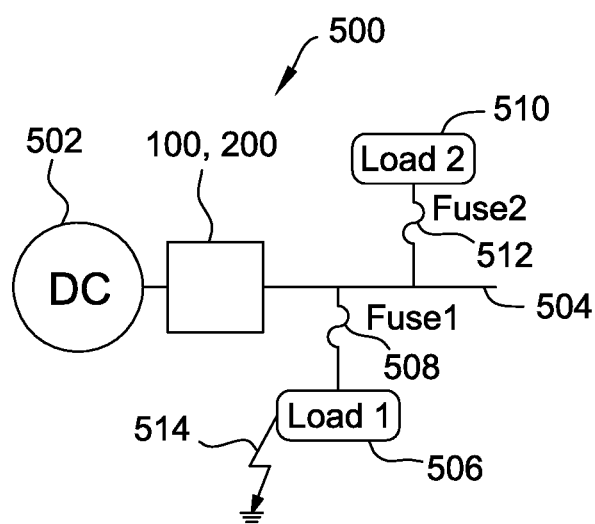

FIG. 5 depicts another hybrid electrical distribution system in an example embodiment.

Figure 6A:
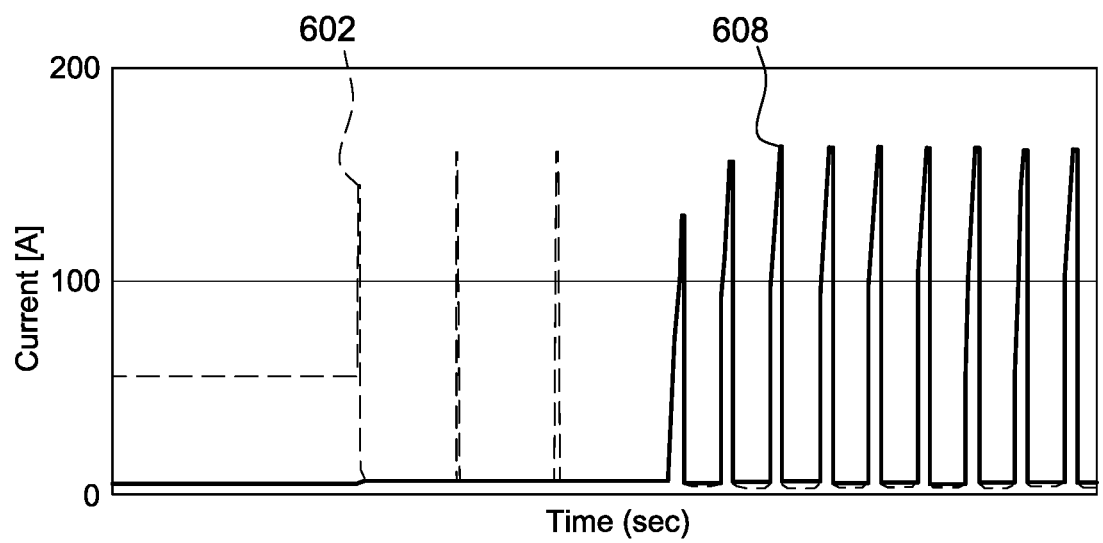
Figure 6B:
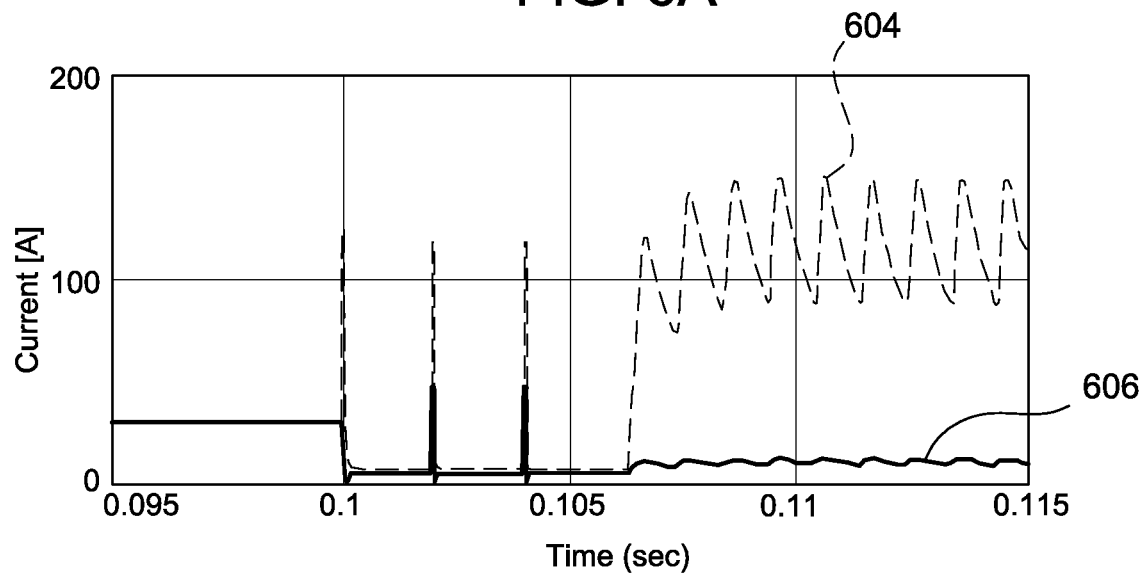

FIGS. 6A and 6B depict simulated current waveforms in the distribution system of FIG. 5 during a fault.

Figure 7:
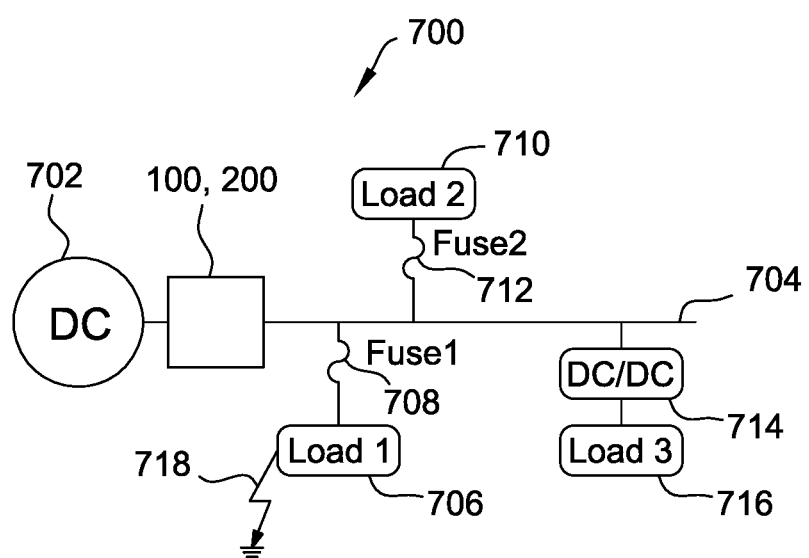

FIG. 7 depicts another hybrid electrical distribution system in an example embodiment.

Figure 8:
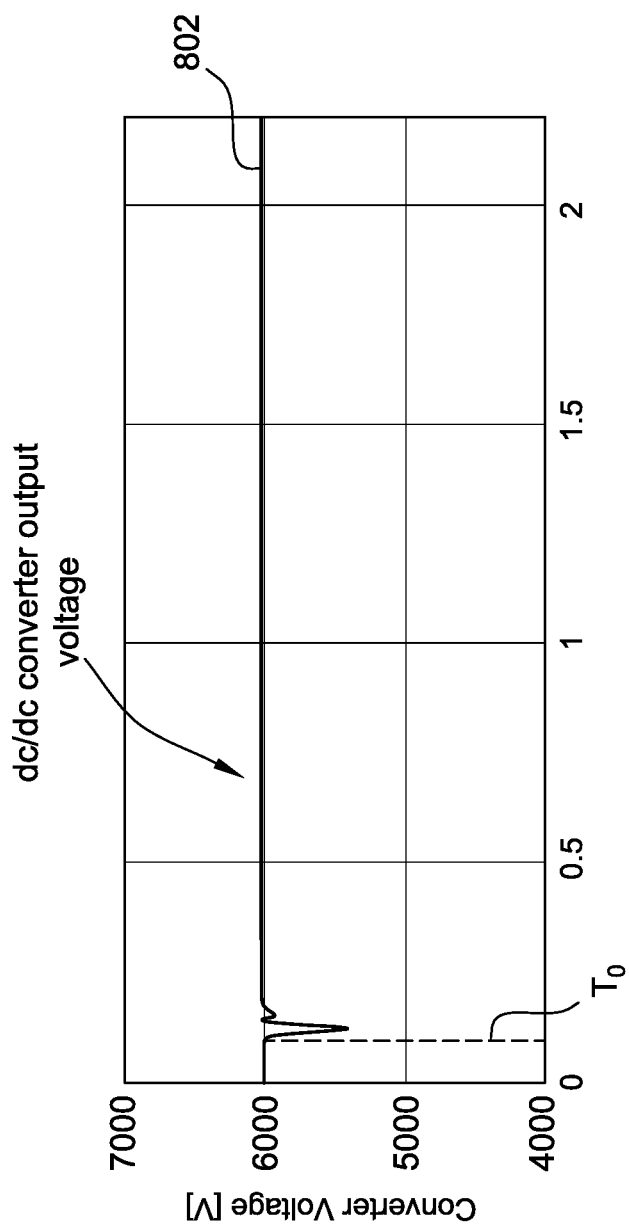

FIG. 8 depicts a simulated voltage waveform in the distribution system of FIG. 7 during a fault.

Figure 9:
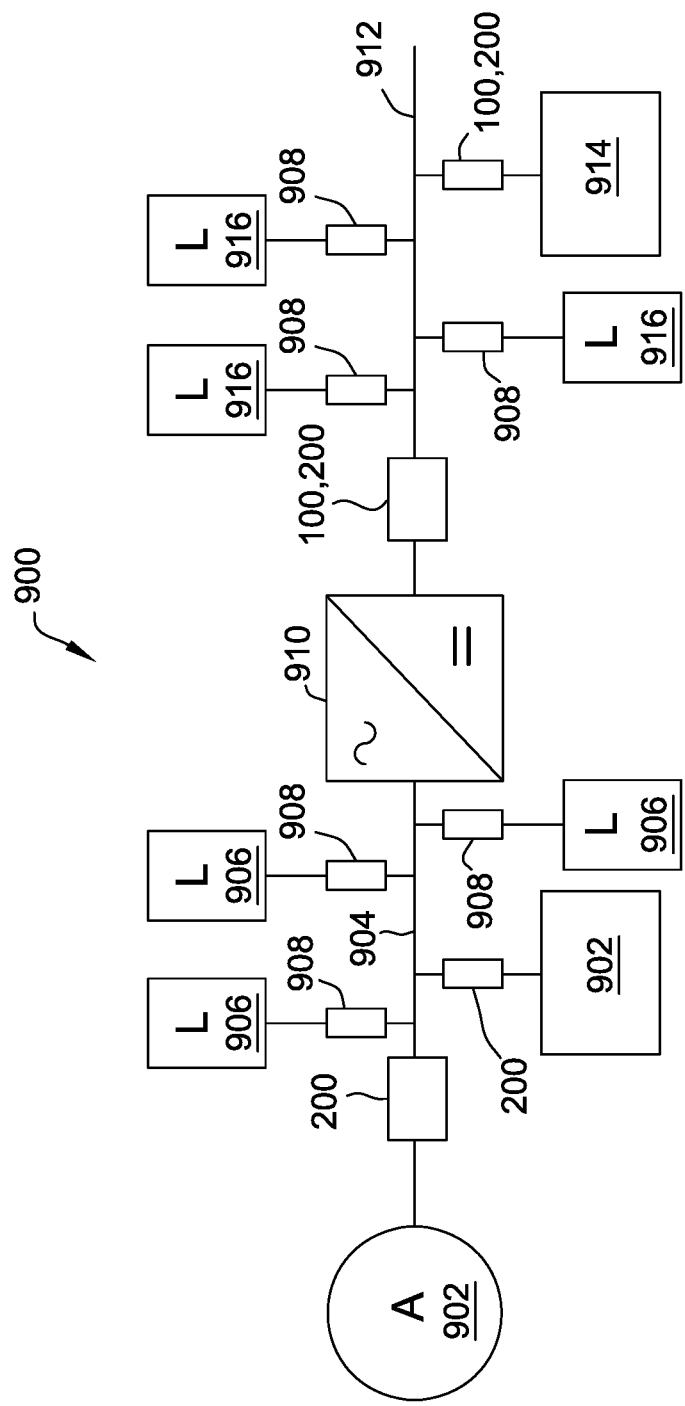

FIG. 9 depicts another hybrid electrical distribution system in an example embodiment.

Figure 10:
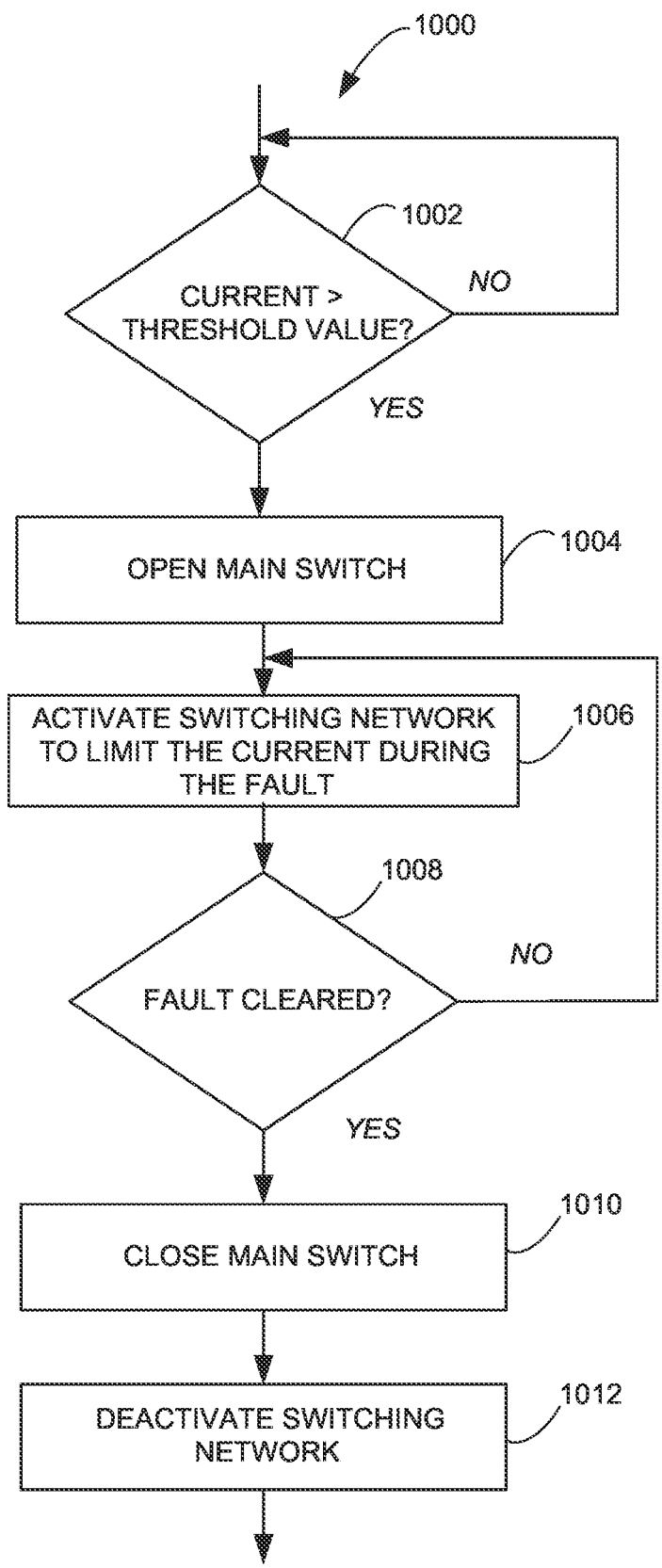

FIG. 10 is a flow chart of a method for current-limiting a fault current between a source and a load during a fault in an example embodiment.

Unless otherwise indicated, the drawings provided herein are meant to illustrate features of embodiments of this disclosure. These features are believed to be applicable in a wide variety of systems comprising one or more embodiments of this disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

As used herein, the terms "processor" and "computer," and related terms, e.g., "processing device," "computing device," and "controller" are not limited to just those integrated circuits referred to in the art as a computer, but broadly refers to a microcontroller, a microcomputer, an analog computer, a programmable logic controller (PLC), an application specific integrated circuit (ASIC), and other programmable circuits, and these terms are used interchangeably herein. In the embodiments described herein, "memory" may include, but is not limited to, a computer-readable medium, such as a random-access memory (RAM), a computer-readable non-volatile medium, such as a flash memory. Alternatively, a floppy disk, a compact disc-read only memory (CD-ROM), a magneto-optical disk (MOD), and/or a digital versatile disc (DVD) may also be used. Also, in the embodiments described herein, additional input channels may be, but are not limited to, computer peripherals associated with an operator interface such as a touchscreen, a mouse, and a keyboard. Alternatively, other computer peripherals may also be used that may include, for example, but not be limited to, a scanner. Furthermore, in the example embodiment, additional output channels may include, but not be limited to, an operator interface monitor or heads-up display. Some embodiments involve the use of one or more electronic or computing devices. Such devices typically include a processor, processing device, or controller, such as a general purpose central processing unit (CPU), a graphics processing unit (GPU), a microcontroller, a reduced instruction set computer (RISC) processor, an ASIC, a programmable logic controller (PLC), a field programmable gate array (FPGA), a digital signal processing (DSP) device, and/or any other circuit or processing device capable of executing the functions described herein. The methods described herein may be encoded as executable instructions embodied in a computer readable medium, including, without limitation, a storage device and/or a memory device. Such instructions, when executed by a processing device, cause the processing device to perform at least a portion of the methods described herein. The above examples are not intended to limit in any way the definition and/or meaning of the term processor and processing device.

Renewable energy sources and energy storage are becoming more prevalent in electrical distribution systems. As renewable energy sources and energy storage are typically Direct Current (DC), their integration into a DC distribution is more efficient, more reliable, and less expensive than in an Alternating Current (AC) distribution. Therefore, the traditional pure AC distribution system potentially can evolve into a hybrid AC and DC distribution system. In a conventional AC distribution protection scheme, reclosers or circuit breakers are installed at substations or feeders, and fuses are installed at laterals of each feeder. The feeder reclosers or breakers react to temporary faults to open and protect downstream fuses. The feeder reclosers or breakers fail to reclose at permanent faults and the downstream fuses close to the faults melt. Therefore, customers at laterals may experience a temporary loss of power due to the opening of the feeder reclosers or breakers. This fuse-saving protection design is low-loss, low-cost, and is suitable for a high occurrence of temporary faults of conventional AC distribution feeders.

With the integration of renewable energy sources and energy storage into a distribution system, a section of a distribution system may become a DC distribution system for easy and efficient integration. An interfacing converter maybe be utilized to integrate the AC and DC portions of the distribution system. A protection scheme for a DC distribution system may consider the low-loss, low-cost, and high temporary fault occurrence of distribution protection. AC and DC fault currents have different features, including different time constants. In a hybrid AC and DC distribution, the protection coordination between AC and DC protection may also be designed in consideration of different fault current time constants and protection devices in AC and DC subsystems.

In the embodiments described herein, hybrid circuit protection devices are disclosed that satisfy the protection speed and coordination constraints between AC and DC distribution systems. Further, since the conventional distribution protection is not selective at lateral temporary faults, the hybrid circuit protection devices disclosed herein provide selectivity. In this regard, the downtime of the distribution is reduced, and the system reliability is improved.

More specifically, the pending application discloses hybrid circuit protection devices that include a fault current limiting capability. During normal operation, currents flow through a main breaker or a main switch (e.g., a mechanical breaker or low-loss solid state breaker) and the protected system operates with high efficiency. During a fault, a switching network in parallel with the main breaker is operated to current-limit the fault current to the downstream loads. The fault currents are current-limited and thus prevent damage due to high fault currents to protected equipment and devices. Concurrently, at least a reduced rated power is supplied to the downstream loads. A fuse saving principle of a conventional low-cost distribution protection is still applicable and the system reliability is improved as the loads may still operate at a reduced or a full rated power during the fault current limiting operating state.

Figure 1:
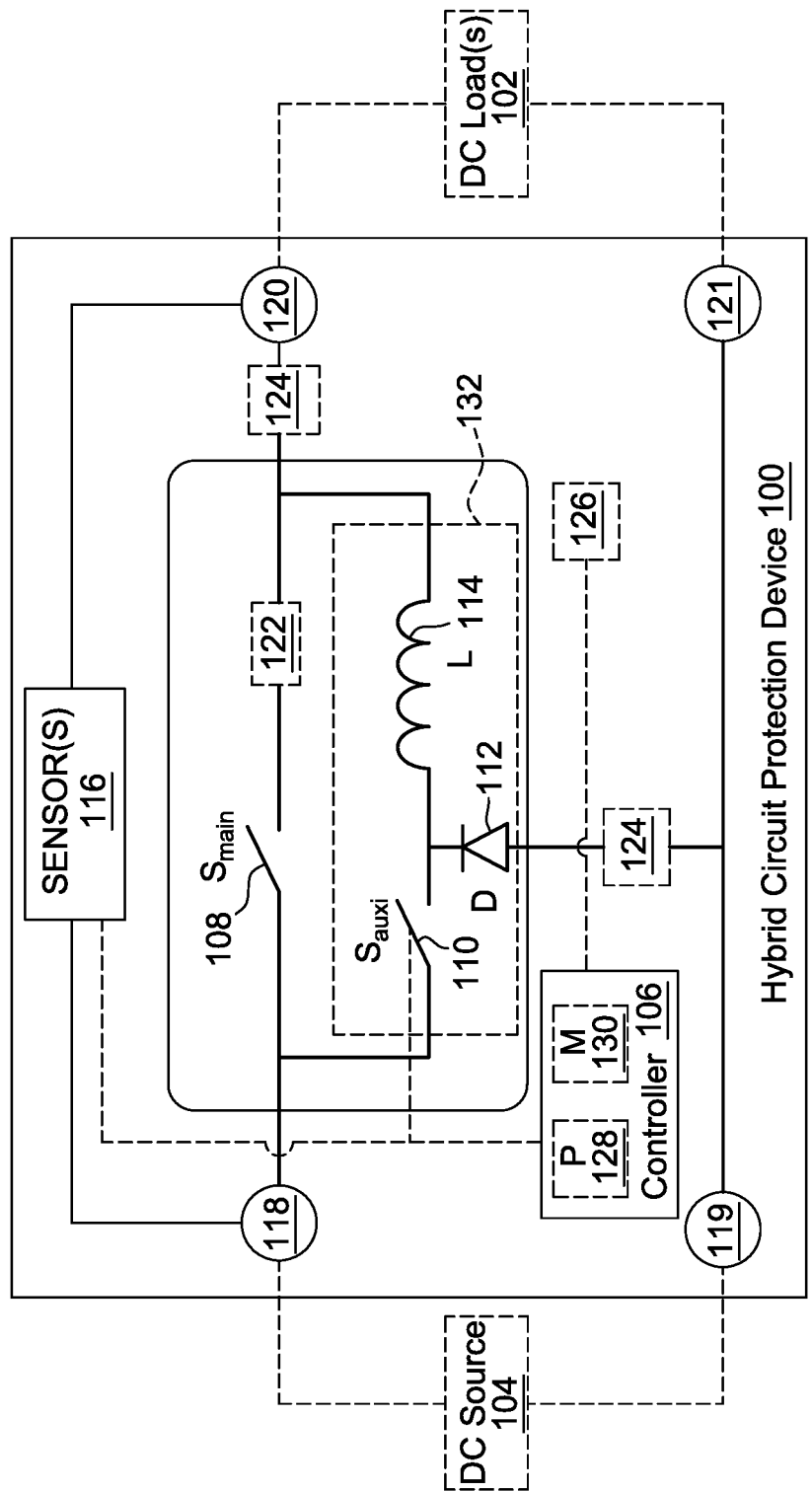
FIG. 1 depicts a hybrid circuit protection device in an example embodiment.

FIG. 1 depicts a hybrid circuit protection device 100 in an example embodiment. In this embodiment, protection device 100 couples one or more DC loads 102 to a DC source 104 and provides protection and fault current limiting capabilities between DC source 104 and DC loads 102. In this embodiment, protection device 100 includes a controller 106, which controls the operation of protection device 100, a main switch 108 (also referred to as a main breaker), an auxiliary switch 110, a diode 112, an inductor 114, and one or more sensors 116. Protection device 100 further includes input terminals 118, 119 coupled to DC source 104 and output terminals 120, 121 coupled to DC load 102. Input terminal 119 and output terminal 121 are depicted as sharing a common circuit path, although input terminal 119 and output terminal 121 may be electrically isolated from each other in other embodiments. In this embodiment, auxiliary switch 110, diode 112, and inductor 114 form a switching network 132 that is coupled in parallel with main switch 108.

During normal operation, main switch 108 is closed and provides a low-loss current path between DC source 104 and DC loads 102. Auxiliary switch 110 is open during normal operation, resulting in switching network 132 being deactivated. If a fault is detected (e.g., if sensors 116 detect a fault current between DC source 104 and DC loads 102 that is greater than a threshold value), main switch 108 is opened (e.g., by controller 106 or independently by main switch 108 itself). In some embodiments, main switch 108 is a mechanical breaker, and an optional solid-state breaker 122 is in series with main switch 108 to reduce the turn-off time normally associated with a mechanical version of main switch 108. Controller 106 then activates switching network 132 by operating auxiliary switch 110 on and off over a switching period to current-limit the fault current from DC source 104 to DC loads 102 to a value that is less than the initial value of the fault current. For example, if the trip current value of main switch 108 is 150 Amps and the initial fault current value is 550 Amps, main switch 108 trips open. Switching network 132 operates to current-limit the fault current to a value less than 550 Amps, e.g., 250 Amps, which allows DC loads 102 to continue to be powered by DC source 104. Depending the power requirements of DC loads 102, DC loads 102 may continue to operate normally during the fault. For example, DC loads 102 may include DC/DC or DC/AC converters, which may continue to operate normally even if an input voltage at the DC/DC or DC/AC converters is depressed during the fault.

When auxiliary switch 110 is on during a switching period set by controller 106, DC source 104 is electrically coupled to DC loads 102 in series through auxiliary switch 110 and inductor 114. When auxiliary switch 110 is off during the switching period, the current to DC load 102 is conducted by diode 112 and inductor 114. Generally, auxiliary switch 110, diode 112, and inductor 114 form a buck regulator that is operated by controller 106 to current-limit the fault current supplied to DC loads 102. In some embodiments, controller 106 uses a Pulse Width Modulation (PWM) control scheme to current-limit the fault current supplied to DC loads 102. In some embodiments, protection device 100 includes mechanical disconnects 124 that are used to galvanically isolate protection device 100 during maintenance. Generally, protection device 100 provides a continuous limited current flow from DC source 104 to DC loads 102 during fault conditions, thereby enabling limited functionality at DC loads 102 even in the presence of fault. For example, depending on the limited fault current supplied by protection device 100 and the electrical power utilized by DC loads 102, DC loads 102 may continue to operate normally while the fault is identified and either cleared or isolated, thereby minimizing the disruption to DC loads 102 during faults. In some embodiments, protection device 100 includes a network interface 126, which provides networking capabilities to protection device 100. Network interface 126 is used by controller 106, in some embodiments, to coordinate activities between different protection devices 100 in an electrical distribution system. Network interface 126 may include wired or wireless interfaces in various embodiments.

In FIG. 1, protection device 100 has been simplified for purposes of discussion, and protection device 100 includes different configurations in other embodiments. In this regard, controller 106 includes any system, component, or device which performs the functionality described herein for controller 106. In some embodiments, controller includes a processor 128 coupled to a memory 130. Processor 128, in some embodiments, executes instructions stored in memory 130 in order to perform the functions described herein for controller 106. Main switch 108 includes any system, component, or device which operates to disconnect input terminal 118 from output terminal 120 in response to a fault detected by protection device 100. In some embodiments, main switch 108 operates independently of controller 106 to disconnect input terminal 118 from output terminal 120 (e.g., utilizing information directly from sensors 116). In other embodiments, main switch 108 operates under the direction of controller 106 in response to controller 106 detecting the fault (e.g., utilizing sensors 116). In some embodiments, main switch 108 is a mechanical switch, which provides a low-loss forward conduction path between input terminal 118 and output terminal 120. In other embodiments, main switch 108 is a low-loss solid-state switch. In embodiments where main switch 108 is a low-loss solid state switch, main switch 108 includes one or more Insulated-Gate Bipolar Transistors (IGBTs), Reverse Blocking-Integrated Gate Commutated Thyristors (RB-IGCTs), Silicon-Carbide Metal-Oxide-Semiconductor Field-Effect Transistors (SiC MOSFETs), Gallium Nitride (GAN) FETs, etc.

Auxiliary switch 110 includes any system, component, or device that is switchable by controller 106 to provide a limited current to DC loads 102 during a fault. Auxiliary switch 110 includes one or more IGBTs, RB-IGCTs, SiC MOSFETs, GAN FETs, etc., in various embodiments. Diode 112 includes any system, component, or device which operates to selectively conduct current when auxiliary switch 110 is off during a switching period. Diode 112 includes an active switching element in some embodiments. For instance, Diode 112 may be replaced by a solid-state switch in some embodiments, which is controlled by controller 106 to selectively conduct current during the off interval of the switching period when protection device 100 operates in a buck mode to supply a limited fault current to DC loads 102.

Inductor 114 includes any system, component, or device which provides an inductance for storing energy during the on interval of the switching period for protection device 100. Sensors 116 measure a current and/or voltage at protection device 100. Sensors 116 are coupled to input terminal 118 and output terminal 120 in FIG. 1, but sensors 116 may be, in addition or instead of, coupled to different sensing points in protection device 100 in other embodiments. In this regard, sensors 116 include any system, component, or device which measures information indicative of a fault or representative of a fault, such as a current traversing through protection device 100 between DC source 104 and DC loads 102, a voltage at input terminal 118 and/or input terminal 119, a voltage at output terminal 120 and/or output terminal 121, harmonic noise measured at input terminals 118, 119 and/or output terminals 120, 121, etc.

In embodiments where solid-state breaker 122 is used in combination with a mechanical version of main switch 108, solid-state breaker 122 includes any system, component, or device which operates to selectively open a circuit path between input terminal 118 and output terminal 120. Solid-state breaker 122 may include any type of solid-state device previously described for main switch 108 and auxiliary switch 110.

As discussed above, protection device 100 includes mechanical disconnects 124 in some embodiments to galvanically isolate protection device 100. In this regard, mechanical disconnects 124 include any system, component, or device which selectively provides galvanic isolation to protection device 100. Mechanical disconnect 124 may be manually operated by a service technician during maintenance in some embodiments or controlled by controller 106 in other embodiments.

Figure 2:
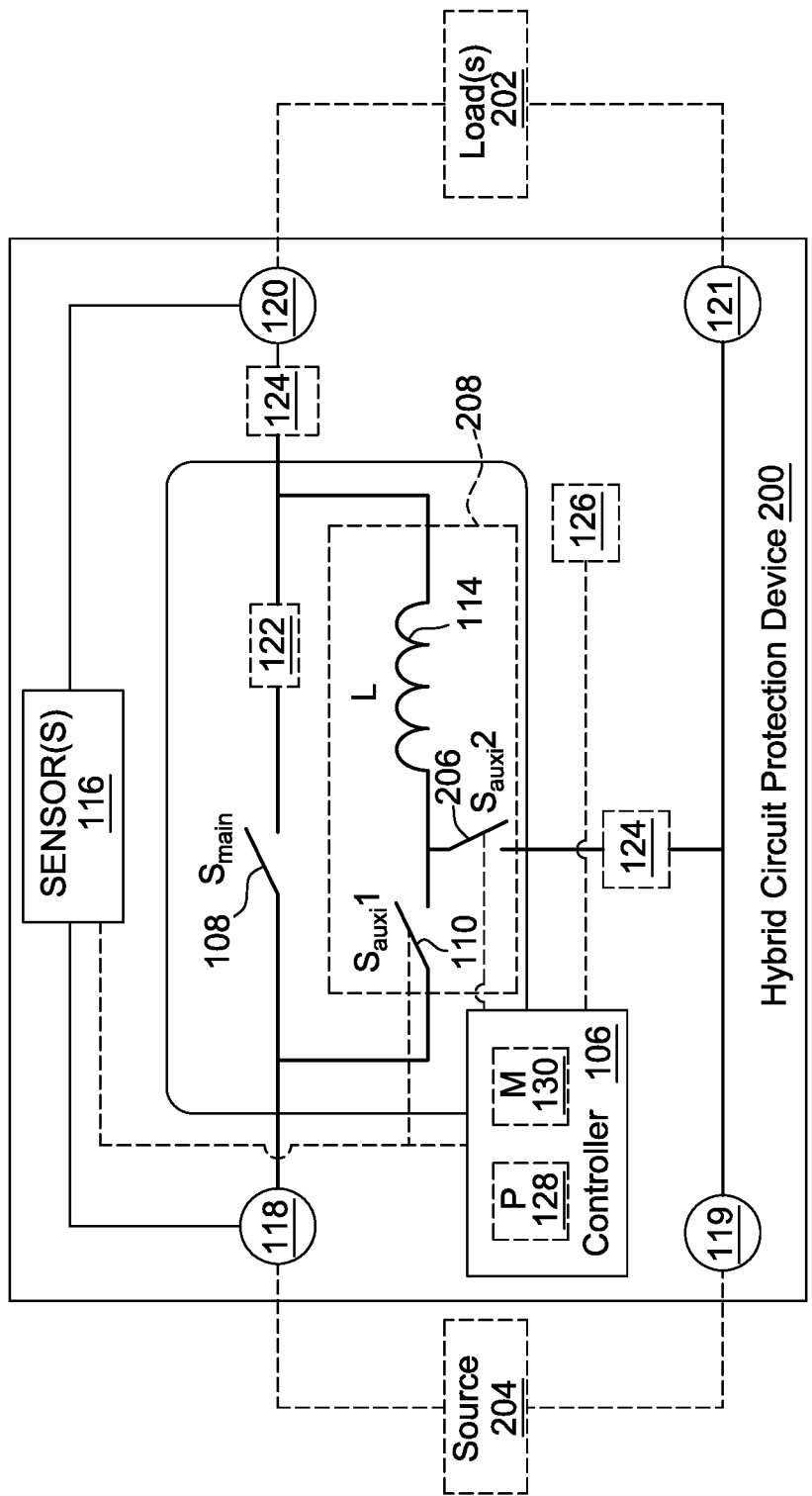
FIG. 2 depicts another hybrid circuit protection device in an example embodiment.

FIG. 2 depicts another hybrid circuit protection device 200 in another example embodiment. In this embodiment, protection device 200 couples one or more loads 202 to a source 204. In this embodiment, source 204 may be a DC source or an AC source and loads 202 may be DC loads or AC loads. In this embodiment, diode 112 (see FIG. 1) is replaced with an auxiliary switch 206, which includes any type of solid-state switch previously described. Auxiliary switches 110, 206, and inductor 114 collectively form a switching network 208 for protection device 200.

Controller 106 operates switching network 208 in this embodiment to provide bi-directional limited fault current to either source 204 or loads 202. For example, during a fault at loads 202, main switch 108 is opened and controller 106 operates auxiliary switches 110, 206 to current-limit the fault current supplied to loads 202, similar to the functionality previously described for protection device 100 of FIG. 1. During a fault at source 204, main switch 108 is opened and controller 106 operates auxiliary switches 110, 206 to current limit the fault current supplied to source 204. For example, if loads 202 include AC/DC converters with a high input capacitance, and a fault at source 204 occurs (an AC source in this example), then protection device 200 operates to current-limit the AC fault current supplied by the input capacitance of the AC/DC converters back to source 204. In another example, if loads 202 include DC/AC converters with a high input capacitance, and a fault at source 204 occurs (a DC source in this example), then protection device 200 operates to current-limit the DC fault current supplied by the input capacitance of the AC/DC converters back to source 204.

In either case, the limited fault current supplied to loads 202 or source 204 includes DC current and AC current. Providing bi-directional current-limited fault currents in hybrid electrical distribution systems advantageously allows protection device 200 to be used for both AC and DC protection, reducing the number of different types of protection devices in a hybrid electrical distribution system.

FIG. 3 depicts a hybrid electrical distribution system 300 in an example embodiment, and FIGS. 4A, 4B, and 4C depict simulated current and voltage waveforms in the distribution system 300 during a fault. In this embodiment, distribution system 300 includes an AC source 302, which supplies power to an AC/DC converter 304. AC/DC converter 304 is coupled to a DC bus 306 via protection device 100, 200. A first load 308 is coupled to DC bus 306 via a first fuse 310 and a second load 312 is coupled to DC bus 306 via a second fuse 314. With a fault 316 present at first load 308, a fault current 402 (see FIG. 4A) through main switch 108 initially rises to a high current level (e.g., 500A in this simulation, see FIG. 4A). Initially, a voltage 406 on DC bus 306 dips due the high initial value of fault current 402 (see FIG. 4B), and diode currents 408, 410, 412 in AC/DC converter 304 rise to a high level (see FIG. 4C). Protection device 100, 200 opens main switch 108, and operates to supply a current-limited fault current 404 (see FIG. 4A) to DC bus 306, which stabilizes voltage 406 on DC bus 306 and reduces diode currents 408, 410, 412 in AC/DC converter 304. Voltage 406 on DC bus 306 in the simulation is less than its initial value of 40,000 volts, but it is sufficient in this example to ensure the reduced rating operation of second load 312 during fault 316. In this example, main switch 108 is a mechanical device that does not perform re-closing operations to attempt to clear fault 316.

FIG. 5 depicts another hybrid electrical distribution system 500 in an example embodiment, and FIGS. 6A and 6B depict simulated current waveforms in distribution system 500 during a fault. In this embodiment, distribution system 500 includes a DC source 502, which is coupled to a DC bus 504 via protection device 100, 200. A first load 506 is coupled to DC bus 504 via a first fuse 508 and a second load 510 is coupled to DC bus 504 via a second fuse 512. With a fault 514 present at first load 506, a current 602 through main switch 108 initially rises to a high level (e.g., 150A in this simulation, see FIG. 6A). Main switch 108 is a solid-state device in this simulation, and main switch 108 is repetitively opened and closed (e.g., either under direction of controller 106 or automatically by main switch 108 itself) in order to try and clear fault 514. FIG. 6B depicts a first current 604 at first load 506 and a second current 606 at second load 510 during fault 514 (see FIG. 6B). After main switch 108 is reclosed twice, protection device 100, 200 opens main switch 108, and operates to supply a current-limited fault current 608 (e.g., at a 1 Kilohertz switching frequency, see FIG. 6A) to DC bus 504.

FIG. 7 depicts another hybrid electrical distribution system 700 in an example embodiment, and FIG. 8 depicts a simulated voltage waveform in distribution system 700 during a fault. In this embodiment, distribution system 700 includes a DC source 702, which is coupled to a DC bus 704 via protection device 100, 200. A first load 706 is coupled to DC bus 704 via a first fuse 708 and a second load 710 is coupled to DC bus 704 via a second fuse 712. A DC/DC converter 714 is coupled to DC bus 704 and supplies a third load 716. With a fault 718 present at first load 706, an output voltage 802 of DC/DC converter 714 initially dips at $T_0$ when main switch 108 is opened and protection device 100, 200 supplies DC bus 704 with a limited fault current. Output voltage 802 of DC/DC converter 714 recovers and continues to supply third load 716 with electrical power during fault 718.

FIG. 9 depicts another hybrid electrical distribution system 900 in an example embodiment. In this embodiment, AC sources 902 are electrically coupled to an AC bus 904 via protection devices 200, AC loads 906 are electrically coupled to AC bus 904 via fuses 908, and an AC/DC converter 910 has an input coupled to AC bus 904. AC/DC converter 910 is electrically coupled to a DC bus 912 via protection device 100, 200. A DC source 914 is also coupled to DC bus 912 via protection device 100, 200. DC loads 916 are electrically coupled to DC bus 912 via fuses 908. In distribution system 900, protection devices 100, 200 are placed at the feeders and sources 902, 914 in order to limit fault current contributions from sources 902, 914. During the fault current limiting operation, downstream healthy loads can maintain full or reduced rated operation with improved voltage inputs. At any fault in distribution system 900, protection devices 100, 200 react to the fault and start to current-limit the fault current. By modulating or limiting the fault current during faults, high fault currents do not flow through the upstream and downstream fault paths and thus prevent damages to equipment and devices. At the same time, a reduced or even full rated operation can be maintained for the rest of healthy loads in distribution system 900.

FIG. 10 is a flow chart of a method 1000 for current-limiting a fault current between a source and a load in an example embodiment. Method 1000 will be discussed with respect to protection device 100, 200, although method 1000 may be performed by other devices, not shown. The steps of method 1000 are not all inclusive, and method 1000 may include other steps, not shown. Further, the steps of method 1000 may be performed in a different order.

Referring to FIGS. 1 and 2, during normal operation of protection device 100, 200 main switch 108 is closed, and the switching network 132, 208 is deactivated. If a fault occurs, then an initial value of the fault current rises to a high level, higher than a threshold value or trip current value (see step 1002), and main switch 108 then opens (see step 1004).

Controller 106 operates switching network 132, 208 to current-limit the fault current to less than its initial value (see step 1006). For example, the fault current rises to about 1100 Amps, which is higher than a trip value of 250 Amps for main switch 108, causing main switch 108 to open. Controller 106 operates switching network 132, 208 to current-limit the initial 1100 Amp fault current to a value less than 1100 Amps. For example, controller 106 operates switching network 132, 208 (e.g., by modifying the duty cycle of auxiliary switch 110 (see FIG. 1) and/or auxiliary switch 206) to current-limit the fault current to 550 Amps.

If the fault is cleared (e.g., by isolating the fault, see step 1008), main switch 108 is closed (see step 1010) and controller 106 deactivates switching network 132, 208 (see step 1012). Protection device 100, 200 returns to normal operation by providing a low-loss current path between sources and loads through main switch 108.

An example technical effect of the apparatus and methods described herein includes one or more of: (a) improved performance using mechanical breakers or low-loss solid-state switches during normal operation; (b) current-limiting fault currents during faults; and (c) continuing to supply downstream loads during faults to minimize the disruption to the downstream loads during faults.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A hybrid circuit protection device for current-limiting a fault current between a source and a load during a fault, the hybrid circuit protection device comprising:
    an input configured to couple to the source;
    an output configured to couple to the load;
    a return configured to couple the source to the load;
    a main switch configured to selectively couple the input to the output;
    a switching network comprising a solid-state switch in series with an inductor, wherein the solid-state switch in series with the inductor is coupled in parallel with the main switch; and
    a controller configured to:
        determine that the main switch has opened in response to the fault current, wherein the fault current has an initial value; and
        modify a duty cycle of the solid-state switch to current-limit the fault current to less than the initial value during the fault.

2. The hybrid circuit protection device of claim 1, wherein:
    the solid-state switch has a first terminal coupled to the input and a second terminal,
    the switching network further comprises a diode having an anode coupled to the return and a cathode coupled to the second terminal of the solid-state switch, and
    the inductor has a third terminal coupled to the cathode of the diode and a fourth terminal coupled to the output.

3. The hybrid circuit protection device of claim 2, further comprising:
    at least one mechanical disconnect that provides galvanic isolation for the hybrid circuit protection device.

4. The hybrid circuit protection device of claim 1, wherein:
    the main switch comprises a mechanical breaker,
    the hybrid circuit protection device further comprises a solid-state breaker in series with the mechanical breaker between the input and the output, and
    the controller is further configured to open the solid-state breaker in response to the fault current.

5. The hybrid circuit protection device of claim 1, wherein:
    the controller is further configured to:
        determine that the main switch has closed; and
        deactivate the solid-state switch to disable a current path through the switching network between the input and the output.

6. The hybrid circuit protection device of claim 1, further comprising:
    a current sensor that is configured to sense the fault current between the input and the output,
    wherein the controller is further configured to:
        measure the fault current using the current sensor;
        determine if the initial value of the fault current is greater than a threshold value; and
        open the main switch in response to determining that the initial value is greater than the threshold value.

7. The hybrid circuit protection device of claim 1, wherein:
    the solid-state switch comprises a first auxiliary switch having a first terminal coupled to the input and a second terminal,
    the switching network further comprises a second auxiliary switch having a third terminal coupled to the return and a fourth terminal coupled to the second terminal of the first auxiliary switch,
    the inductor has a fifth terminal coupled to the second terminal of the first auxiliary switch and the fourth terminal of the second auxiliary switch, and the inductor has a sixth terminal coupled to the output, and
    the controller is further configured to modify a duty cycle of the second auxiliary switch to current-limit the fault current during the fault.

8. The hybrid circuit protection device of claim 1, wherein:
    the solid-state switch comprises one or more Insulated-Gate Bipolar Transistors, one or more Reverse Blocking-Integrated Gate Commutated Thyristors, one or more Silicon-Carbide Metal-Oxide-Semiconductor Field-Effect Transistors, and/or one or more Gallium Nitride Field-Effect Transistors.

9. A method operable by a hybrid circuit protection device for current-limiting a fault current between a source coupled to an input of the hybrid circuit protection device and a load coupled to an output of the hybrid circuit protection device during a fault, the method comprising:
    determining if an initial value of the fault current through a main switch is greater than a threshold value, wherein the main switch selectively couples the input with the output; and responsive to determining that the initial value of the fault current is greater than the threshold value:
    opening the main switch; and
    modifying a duty cycle of a solid-state switch in series with an inductor to current-limit the fault current to less than the initial value during the fault, wherein the solid-state switch in series with the inductor is coupled in parallel with the main switch.

10. The method of claim 9, further comprising:
determining if the fault has been cleared; and
responsive to determining that the fault has been cleared:
    closing the main switch; and
    deactivating the solid-state switch to disable a current path between the input and the output.

11. A hybrid circuit protection device for current-limiting a fault current between a source and a load during a fault, the hybrid circuit protection device comprising:
    a first input terminal and a second input terminal configured to couple to the source;
    a first output terminal and a second output terminal configured to couple to the load;
    a main switch configured to selectively couple the first input terminal with the first output terminal;
    a switching network comprising:
        a solid-state switch in series with an inductor, the solid-state switch in series with the inductor coupling the first input terminal with the first output terminal; and
        a device forming a selective conduction path from a junction between the solid-state switch and the inductor to the second input terminal and the second output terminal; and
    a controller configured to:
        determine that the main switch has opened in response to the fault current, wherein the fault current has an initial value; and
        modify a duty cycle of the solid-state switch to current-limit the fault current to less than the initial value during the fault.

12. The hybrid circuit protection device of claim 11, wherein:
    the device comprises a diode having an anode coupled to the second input terminal and the second output terminal and a cathode coupled to the junction between the solid-state switch and the inductor.

13. The hybrid circuit protection device of claim 11, wherein:
    the solid-state switch comprises a first solid-state switch,
    the device comprises a second solid-state switch, and
    the controller is further configured to modify the duty cycle of the second solid-state switch to current-limit the fault current to less than the initial value during the fault.

14. The hybrid circuit protection device of claim 11, further comprising:
    at least one mechanical disconnect that provides galvanic isolation for the hybrid circuit protection device.

15. The hybrid circuit protection device of claim 11, wherein:
    the main switch comprises a mechanical breaker,
    the hybrid circuit protection device further comprises a solid-state breaker in series with the mechanical breaker between the first input terminal and the first output terminal, and
    the controller is further configured to open the solid-state breaker in response to the fault current.

16. The hybrid circuit protection device of claim 11, wherein:
    the controller is further configured to:
        determine that the main switch has closed; and
        modify the duty cycle of the solid-state switch to disable a current path through the switching network between the first input terminal and the first output terminal.

17. The hybrid circuit protection device of claim 11, further comprising:
    a current sensor that is configured to sense the fault current between the first input terminal and the first output terminal,
    wherein the controller is further configured to:
        measure the fault current using the current sensor;
        determine if the initial value of the fault current is greater than a threshold value; and
        open the main switch in response to determining that the initial value is greater than the threshold value.

18. The hybrid circuit protection device of claim 17, wherein:
    the controller is further configured to:
        operate the main switch to perform a sequence of reclosing operations to attempt to clear the fault; and
        modify the duty cycle of the solid-state switch to current-limit the fault current in response to determining that the main switch has performed a last reclosing operation of the sequence of reclosing operations and that the main switch remains open.

19. The hybrid circuit protection device of claim 11, wherein:
    the main switch is configured to perform a sequence of reclosing operations to attempt to clear the fault, and
    the controller is configured to modify the duty cycle of the solid-state switch to current-limit the fault current in response to determining that the main switch has performed a last reclosing operation of the sequence of reclosing operations and that the main switch remains open.

20. The hybrid circuit protection device of claim 11, wherein:
    the main switch comprises one or more Insulated-Gate Bipolar Transistors, one or more Reverse Blocking-Integrated Gate Commutated Thyristors, one or more Silicon-Carbide Metal-Oxide-Semiconductor Field-Effect Transistors, and/or one or more Gallium Nitride Field-Effect Transistors.

* * * * *